(12) United States Patent
Sakamoto et al.

(10) Patent No.: US 8,248,395 B2
(45) Date of Patent: Aug. 21, 2012

(54) IMAGE DISPLAY DEVICE

(75) Inventors: Mayuko Sakamoto, Osaka (JP); Hiromi Katoh, Osaka (JP); Christopher Brown, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 303 days.

(21) Appl. No.: 12/744,997

(22) PCT Filed: Nov. 17, 2008

(86) PCT No.: PCT/JP2008/070870
§ 371 (c)(1),
(2), (4) Date: May 27, 2010

(87) PCT Pub. No.: WO2009/069493
PCT Pub. Date: Jun. 4, 2009

(65) Prior Publication Data
US 2010/0302223 A1    Dec. 2, 2010

(30) Foreign Application Priority Data
Nov. 29, 2007    (JP) .................. 2007-309263

(51) Int. Cl.
*G06F 3/038*    (2006.01)
*G09G 5/00*    (2006.01)

(52) U.S. Cl. ......... 345/207; 345/102; 345/690; 349/110

(58) Field of Classification Search ............ 345/87–89, 345/102, 207, 690; 349/5, 10, 56, 84, 110
See application file for complete search history.

(56) References Cited

U.S. PATENT DOCUMENTS
7,209,107 B2 *  4/2007  Ohmuro et al. .......... 345/92
(Continued)

FOREIGN PATENT DOCUMENTS
EP    2 081 081 A1    7/2009
(Continued)

OTHER PUBLICATIONS
International Search Report for PCT/JP2008/070870, mailed Dec. 16, 2008.
(Continued)

*Primary Examiner* — Kimnhung Nguyen
(74) *Attorney, Agent, or Firm* — Nixon & Vanderhye, P.C.

(57) ABSTRACT

An image display device includes an image display panel (4) with an image detection function, and includes a plurality of pixels disposed in a matrix and a plurality of photosensors (17) disposed in correspondence with the pixels in a display region. The pixels each have a plurality of sub-pixels (5), and a color filter in which colors of color layers are formed in correspondence with the sub-pixels (5) is provided. The photosensors (17) have an incident light wavelength characteristic in which a photoreception sensitivity to light that passes through, among the colors of color layers, the color layer whose color is most toward a short wavelength side is higher than a photoreception sensitivity to light that passes through, among the colors of color layers, the color layer whose color is most toward a long wavelength side, and the photosensors (17) are disposed such that, with respect to a thickness direction of the image display panel (4), photodetection regions (19) of the photosensors (17) overlap with, among the plurality of color layers, the color layer whose color is most toward the long wavelength side. The present invention enables reducing the reflection of a display image on sensor output caused by optical interference.

8 Claims, 8 Drawing Sheets

U.S. PATENT DOCUMENTS

| | | | |
|---|---|---|---|
| 7,280,102 B2 * | 10/2007 | Abileah et al. | 345/204 |
| 7,651,235 B2 * | 1/2010 | Seki | 362/97.3 |
| 2003/0020028 A1 * | 1/2003 | Iihama et al. | 250/556 |
| 2007/0052874 A1 | 3/2007 | Nakamura | |
| 2007/0109239 A1 | 5/2007 | den Boer et al. | |
| 2007/0187787 A1 * | 8/2007 | Ackerson et al. | 257/428 |
| 2007/0229424 A1 | 10/2007 | Hayashi et al. | |
| 2008/0111780 A1 * | 5/2008 | Abileah et al. | 345/87 |
| 2010/0059296 A9 * | 3/2010 | Abileah et al. | 178/18.09 |
| 2010/0118237 A1 | 5/2010 | Katoh et al. | |

FOREIGN PATENT DOCUMENTS

| | | |
|---|---|---|
| JP | 2006-323199 | 11/2006 |
| JP | 2006-330578 | 12/2006 |
| JP | 2007-011152 | 1/2007 |
| JP | 2007-033789 | 2/2007 |
| JP | 2007-072318 | 3/2007 |
| JP | 2007-271782 | 10/2007 |
| WO | 2008/044368 A1 | 4/2008 |
| WO | 2008/044369 A1 | 4/2008 |
| WO | 2008/044370 | 4/2008 |
| WO | 2008/044371 A1 | 4/2008 |

OTHER PUBLICATIONS

Supplementary EP Search Report mailed Jan. 21, 2011 in EP application 08853866.5.

* cited by examiner

IMAGE DISPLAY DEVICE

This application is the U.S. national phase of International Application No. PCT/JP2008/070870, filed 17 Nov. 2008, which designated the U.S. and claims priority to Japanese Patent Application No. 2007-309263, filed 29 Nov. 2007, the entire contents of each of which are hereby incorporated by reference.

TECHNICAL FIELD

The present invention relates to an image display device with an image detection function that can perform image pick-up.

BACKGROUND ART

In recent years, liquid crystal display devices, which are image display devices, have been widely employed as display devices in computers, mobile phones, PDAs, and game consoles due to their characteristics of being power-conservative, thin, and lightweight. In general, a liquid crystal display device includes a liquid crystal panel and a backlight that illuminates the liquid crystal panel from the rear. The liquid crystal panel is configured by sandwiching a liquid crystal layer between an active matrix substrate and a counter-substrate.

The active matrix substrate is configured by forming a plurality of pixels on a glass substrate in a row-wise and column-wise matrix. Also, in the case of displaying color images, each pixel is normally configured by three sub-pixels. Each sub-pixel includes a TFT and a pixel electrode. Furthermore, the counter-substrate includes a counter-electrode and a color filter provided on a glass substrate. The color filter has red (R), green (G), and blue (B) color layers provided in one-to-one correspondence with the sub-pixels. There are also cases in which the color filter is provided on a TFT substrate.

In the liquid crystal display device, the transmittance of the liquid crystal layer is adjusted for each sub-pixel by adjusting the voltage applied between the pixel electrodes and the counter-electrode. As a result, an image is displayed in a display region of the liquid crystal panel with use of irradiated light from the backlight that has passed through the liquid crystal layer and the color layers.

In this way, conventional liquid crystal display devices include a function for displaying images, but in recent years, a liquid crystal display device also including an image detection function that can pick up an image has been proposed (e.g., see Patent Document 1). A liquid crystal display device with an image detection function such as is disclosed in Patent Document 1 includes a plurality of photodiodes formed in a matrix on an active matrix substrate, and has a position detection function for when the liquid crystal panel is used as a touch panel and an image sensor function for when the liquid crystal panel is used as a scanner.

Patent Document 1: JP 2007.072318A

DISCLOSURE OF INVENTION

Problem to be Solved by the Invention

With such a liquid crystal display device including an image detection function that can pick up an image, the image sensor is configured by the plurality of photodiodes, and the photodiodes are disposed on the active matrix substrate in the display region. For this reason, in the case of picking up an image while simultaneously displaying an image, there has been the problem that display image light, that is to say, irradiated light from the backlight that has passed through the liquid crystal layer is picked up by the photodiodes due to optical interference in which, for example, the display image light is reflected by an interface between constituent members provided on the observer side of the liquid crystal display device, thus becoming noise in the output signal.

An object of the present invention is to solve the above problem and reduce the reflection of a display image on sensor output caused by optical interference in a liquid crystal display device with an image detection function.

Means for Solving Problem

In order to achieve the above object, an image display device according to the present invention is an image display device comprising an image display panel with an image detection function provided with an active matrix substrate and a counter-substrate, the active matrix substrate being provided with a plurality of pixels disposed in a matrix, and a plurality of photosensors disposed in correspondence with the pixels in a display region, the plurality of pixels each having a plurality of sub-pixels, and the image display device comprising a color filter in which colors of color layers are formed in correspondence with the sub-pixels, wherein the photosensors have an incident light wavelength characteristic in which a photoreception sensitivity to light that passes through, among the colors of color layers, the color layer whose color is most toward a short wavelength side is higher than a photoreception sensitivity to light that passes through, among the colors of color layers, the color layer whose color is most toward a long wavelength side, and the photosensors are disposed such that, with respect to a thickness direction of the image display panel, photodetection regions of the photosensors overlap with, among the plurality of color layers, the color layer whose color is most toward the long wavelength side.

Effects of the Invention

As described above, in the image display device according to the present invention, the photosensors are disposed such that, with respect to the thickness direction of the image display panel, the photodetection regions thereof overlap with, among the plurality of color layers, the color layer whose color is most toward the long wavelength side. This enables effectively preventing display image light reflected by an interface between constituent members provided on the observer side of the image display device from being received by the photosensors and becoming noise in the output signal.

DESCRIPTION OF THE INVENTION

Figure 1:
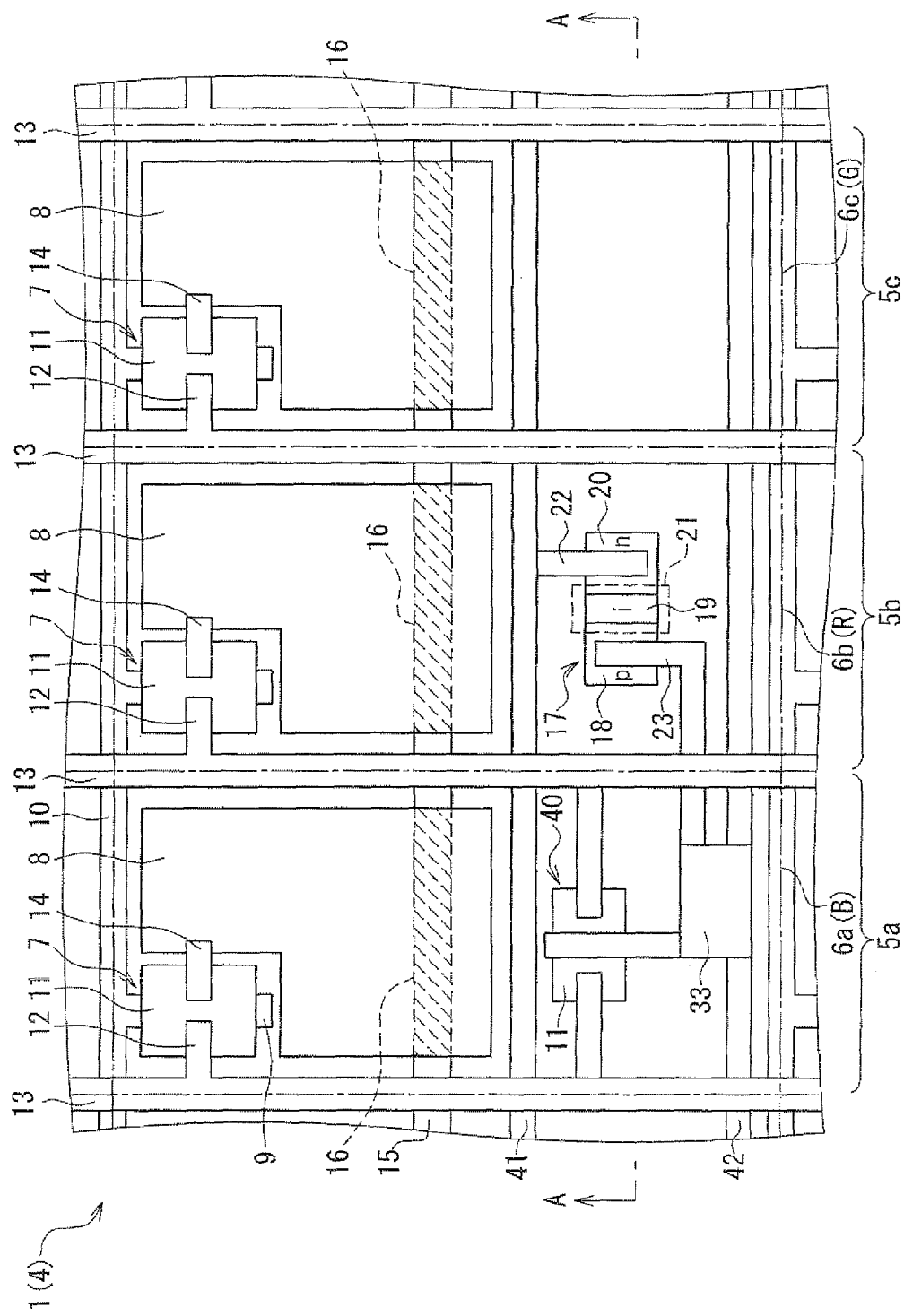
FIG. 1 is a plan view showing part of a configuration of an image display device according to an embodiment of the present invention.

An image display device of the present invention is an image display device including an image display panel with an image detection function provided with an active matrix substrate and a counter-substrate, the active matrix substrate being provided with a plurality of pixels disposed in a matrix, and a plurality of photosensors disposed in correspondence with the pixels in a display region, the plurality of pixels each having a plurality of sub-pixels, and the image display device including a color filter in which colors of color layers are formed in correspondence with the sub-pixels, wherein the photosensors have an incident light wavelength characteristic in which a photoreception sensitivity to light that passes through, among the colors of color layers, the color layer whose color is most toward a short wavelength side is higher than a photoreception sensitivity to light that passes through, among the colors of color layers, the color layer whose color is most toward a long wavelength side, and the photosensors are disposed such that, with respect to a thickness direction of the image display panel, photodetection regions of the photosensors overlap with, among the plurality of color layers, the color layer whose color is most toward the long wavelength side.

This enables effectively preventing display image light that has been reflected by an interface between constituent members provided on the observer side of the image display device from being received by the photosensors and becoming noise in the output signal.

In the image display device of the present invention, it is preferable that the color filter is provided on the counter-substrate, or that the color filter is provided on the active matrix substrate.

Also, it is preferable that the color layers have a high transmission portion in which a transmittance is higher than that of a periphery thereof, and the high transmission portions are provided so as to at least partially overlap with the photodetection regions with respect to the thickness direction of the image display panel. This enables raising the photoreception sensitivity to light from outside the image display device that is originally to be received by the photosensors, while preventing display image light that is a cause of noise from being received.

Also, it is preferable that an area of each of the high transmission portions is greater than an area of each of the photodetection regions of the photosensors, and the high transmission portions are formed so as to entirely cover the photodetection regions. This enables more effectively receiving light from outside the liquid crystal display device.

Also, it is preferable that same colors of the color layers are aligned consecutively in one of a row direction and a column direction of the pixels disposed in a matrix, and a shape of the photodetection regions of the photosensors is an oblong, a lengthwise direction of the oblong shape conforming to the direction in which the same colors of the color layers are aligned consecutively. This enables effectively preventing a color of light having a wavelength for which the photoreception sensitivity of the photosensors is high from reaching the photoreception regions of the photosensors, while ensuring the photoreception sensitivity of the photosensors.

Also, preferably the image display panel is a liquid crystal panel, and it is further preferable that the image display device further includes a backlight that irradiates light on the liquid crystal panel, a light shielding film is included between the photosensors and the backlight, and the light shielding film is formed so as to entirely cover the high transmission portions with respect to a thickness direction of the liquid crystal panel. This enables reducing the quantity of irradiated light from the backlight that is received by the photosensors, with use of a liquid crystal panel that is useful as a thin image display device.

Embodiment

The following describes an image display device of an embodiment of the present invention with reference to the drawings, taking the example of use as a liquid crystal display device. FIG. 1 is an enlarged plan view showing part of a configuration of a liquid crystal display device according to the embodiment of the present invention. Also, FIG. 2 is a cross-sectional view showing a cross section obtained by cutting along a cutting line A-A' in FIG. 1.

Note that FIG. 1 mainly shows the structure of a pixel formed on an active matrix substrate, and regarding the counter-substrate, only the external form of the color filter is shown by dashed-dotted lines. Also, a depiction of optical members such as polarizing plates that are laminated on both outer faces of the liquid crystal panel has been omitted from FIG. 1. FIG. 2 shows only lines that appear in the cross section. Also, a depiction of interlayer insulating films has been omitted from FIG. 1, and hatching has been omitted from FIG. 2.

Figure 2:
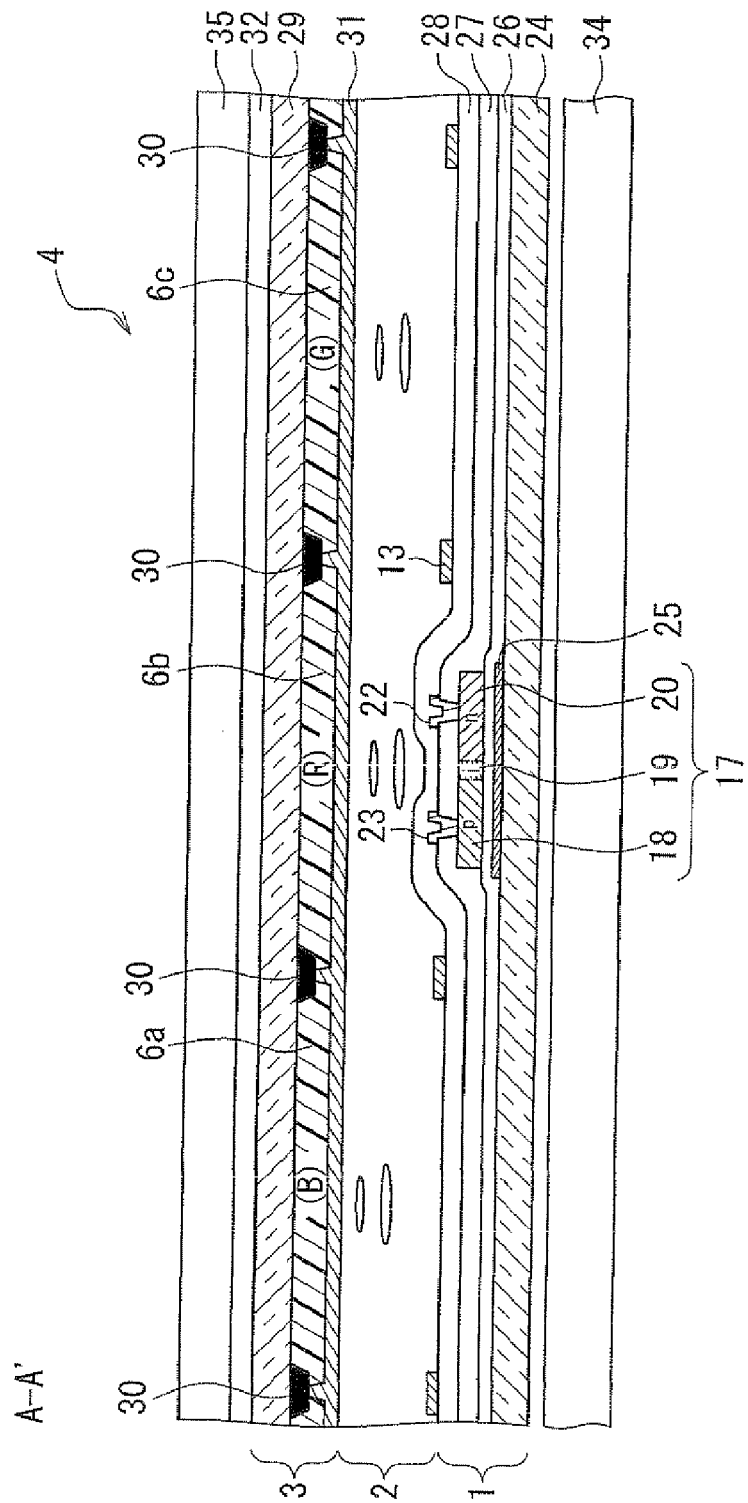
FIG. 2 is an outline cross-sectional view showing a configuration of a cross section obtained by cutting along a cutting line A-A' in FIG. 1.

The liquid crystal display device of the present embodiment includes a liquid crystal panel 4 and a backlight 34 that irradiates the liquid crystal panel 4 from the rear, which are shown in FIG. 2. As shown in FIG. 2, the liquid crystal panel 4 includes an active matrix substrate 1, a liquid crystal layer 2, and a counter-substrate 3, and is formed by sandwiching the liquid crystal layer 2 between the two substrates. Note that although not all are shown in FIG. 2, the liquid crystal display device of the present embodiment additionally includes optical members such as various types of optical films, and an acrylic plate for protecting the liquid crystal panel 4. Among these, FIG. 2 shows only a polarizing plate 32 provided on the surface of the counter-substrate 3 that is on the opposite side from the liquid crystal layer 2, and an acrylic plate 35 that protects the liquid crystal panel 4.

The active matrix substrate 1 includes a plurality of pixels disposed in a row-wise and column-wise matrix. Also, the region of the active matrix substrate 1 in which the pixels are disposed is the display region. Each pixel is configured by three sub-pixels.

FIG. 1 shows an enlarged view of three sub-pixels 5a, 5b, and 5c. As shown in FIG. 1, the sub-pixels 5a, 5b, and 5c each include an active element 7 and a transparent electrode 8. The active elements 7 are TFTs (Thin Film Transistors). The transparent electrodes 8 are pixel electrodes formed from ITO or the like.

Also, in the present embodiment, the active elements 7 each include a silicon film 11 in which a source region and a drain region are formed, and a gate electrode 9. The silicon films 11 are formed from continuous grain silicon due to being superior in terms of charge mobility.

The gate electrodes 9 have each been formed integrally with a gate line 10 disposed along the horizontal direction of the screen. Also, source electrodes 12 are connected to the source regions, and drain electrodes 14 are connected to the drain regions. The source electrodes 12 have each been formed integrally with source wiring 13 disposed along the vertical direction of the screen. The drain electrodes 14 are connected to the transparent electrodes 8. In FIG. 1, reference numeral 15 denotes wiring for storage capacitors, and reference numerals 16 denote regions where storage capacitors are formed.

Also, the active matrix substrate 1 includes photodiodes 17 as photosensors in the display region. The photodiodes 17 are disposed one per pixel as shown in FIGS. 1 and 2. The photodiodes 17 disposed in correspondence with the pixels function as a sensor for image detection. Also, a photodiode active element 40 in which a silicon film 11 for driving the photodiode is included and a photodiode capacitor 33 are disposed in each of the pixels.

In the present embodiment, the photodiodes 17 are PIN diodes that have a lateral structure. As shown in FIG. 2, the photodiodes 17 are formed on a glass substrate 24 that is the base substrate of the active matrix substrate 1, and a silicon film that configures the photodiodes 17 is formed at the same time as and using the same formation step as the image display active element 7 of the liquid crystal panel. For this reason, the photodiodes 17 are also formed from continuous grain silicon that has a superior charge mobility. A p-type semiconductor region (p layer) 18, an intrinsic semiconductor region (i layer) 19 that is a light detection region, and an n-type semiconductor region (n layer) 20 are provided in the stated order along the planar direction in the silicon film of each photodiode 17. Each of the n layers 20 is connected to an RST line 41 via wiring 22, and each of the photodiode capacitors 33 is connected to an RWS line 42.

Due to receiving light, the photodiodes 17 charge/discharge the photodiode capacitors 33 in a display period, and in a sensor output period (a blanking period in which no display signal exists), the accumulated charges are read by the photodiode active elements 40 and output from the source wiring 13.

In the present embodiment, it is sufficient for the i layers 19 to be a region that is closer to being electrically neutral than the adjacent p layers 18 and n layers 20. The i layers 19 are preferably a region that does not include any impurities, or a region in which the conduction electron density and the hole density are equal.

Note that as shown in FIG. 2, an insulating film 26 is formed on the glass substrate 24, and the photodiodes 17 are formed on the insulating film 26. A light shielding film 25 is formed from a conductive metal material or the like below the photodiodes 17 in order to prevent irradiated light from the backlight 34 from entering the photodiodes 17. Furthermore, the photodiodes 17 are covered by interlayer insulating films 27 and 28. Reference numeral 23 denotes wiring connected to the p layers 18, and reference numeral 22 denotes wiring connected to the n layers 20.

Also, as shown in FIGS. 1 and 2, the counter-substrate 3 includes a color filter having a plurality of color layers. The color layers are provided in one-to-one correspondence with the sub-pixels. In the present embodiment, a blue (B) color layer 6a corresponds to the sub-pixel 5a, a red (R) color layer 6b corresponds to the sub-pixel 5b, and a green (G) color layer 6c corresponds to the sub-pixel 5c. Such color layers are formed on a face of the glass substrate 29 that is the base substrate of the counter-substrate 3, so as to overlap with the transparent electrodes 8 of the corresponding sub-pixels with respect to the thickness direction of the liquid crystal panel. Furthermore, a light shielding black matrix 30 is provided between adjacent color layers. Also, a transparent counter-electrode 31 is formed so as to cover all of the color layers.

In this way, the liquid crystal display device of the present embodiment is similar to a conventional liquid crystal display device with an image detection function with respect to the inclusion of an image display function and an image detection function, but different from the conventional liquid crystal display device in that the photodiodes 17 are disposed in conformity with their sensitivity characteristics in order to reduce the reflection of a display image on the photosensors caused by optical interference.

More specifically, in the liquid crystal display device of the present embodiment, the photodiodes 17 are disposed below the red (R) color layer 6b, which is the color for which the sensitivity characteristics of the photodiodes 17 is low, in order to reduce the reflection of a display image on the photodiodes 17 caused by the reflection of light from the backlight, which occurs at an interface between constituent members such as the polarizing plate 32 provided on the surface of the liquid crystal panel, and the acrylic plate 35, which is a protective panel, provided on the observer side. Also, in a more preferable specific example, a high-transmission portion 21 is provided above the photodetection region 19 of each of the photodiodes 17 in order to prevent a detriment to the image detection function for image pick-up. The following is a specific description of the above content.

Figure 3:
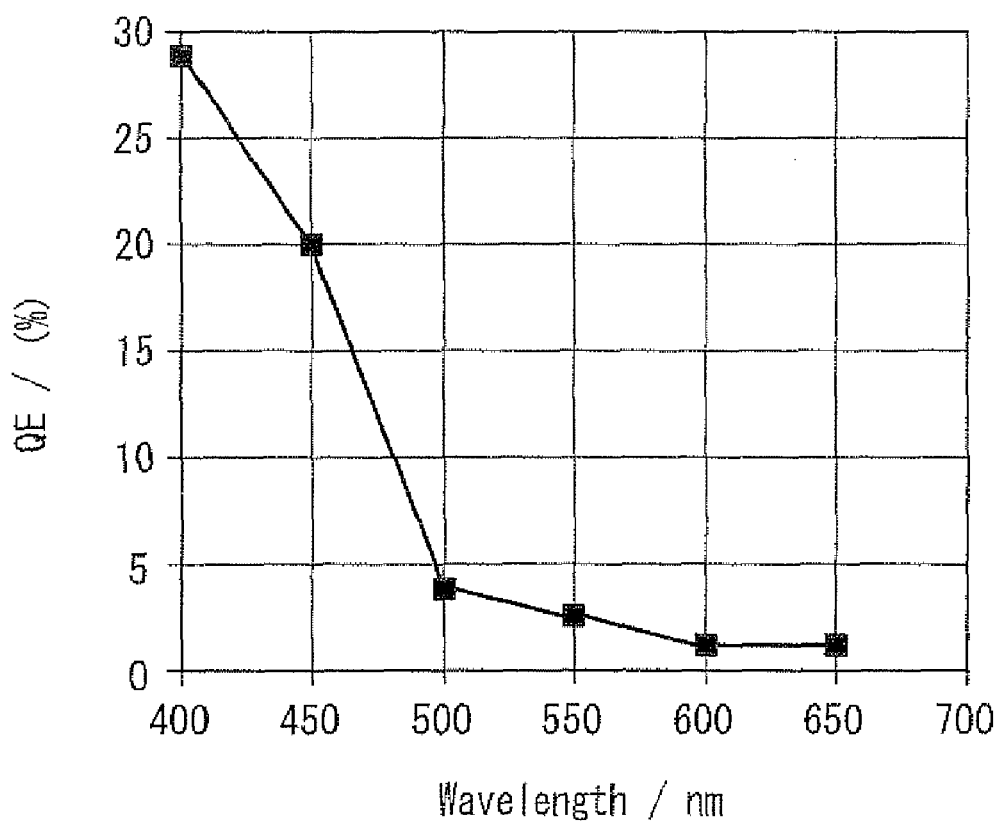
FIG. 3 is a graph showing spectral sensitivity characteristics of photodiodes used in the image display device according to the embodiment of the present invention.

First is a description of the wavelength characteristics of the photoreception sensitivity of the photodiodes with reference to FIG. 3. FIG. 3 shows the photoreception sensitivity characteristics of the photodiodes formed in the liquid crystal panel of the liquid crystal display device according to the present embodiment.

As described above, the silicon film configuring each of the photodiodes 17 is formed from continuous grain silicon at the same time as the silicon film 11 of the active elements 7 that change the orientation of the liquid crystal layer 2 according to a change in the voltage applied to the transparent electrodes 8. For this reason, as shown in FIG. 3, the photoreception sensitivity characteristics with respect to input wavelength of the photodiodes 17 formed in the liquid crystal display device of the present embodiment have wavelength characteristics in which, in the visible light wavelength region, the photoreception sensitivity to short wavelength incident light is higher than the photoreception sensitivity to long wavelength incident light, which is a feature of the photoreception sensitivity characteristics of the photodiodes 17 formed from continuous grain silicon. In other words, there is a tendency in which the photoreception sensitivity increases as the incident light wavelength becomes shorter.

Note that in the example of the photoreception sensitivity characteristics shown in FIG. 3, the sensitivity to incident light having a shorter wavelength is higher than the sensitivity to incident light having a longer wavelength. However, the photodiodes 17 of the liquid crystal display device according to the present embodiment are not necessarily limited to having such a relationship, and it is sufficient for the relationship between the wavelength of incident light and sensitivity to, when viewed overall, have a tendency in which the photoreception sensitivity increases as the incident light wavelength becomes shorter. In other words, it is sufficient for the relationship to be such that, regarding transmitted light from the color filters provided in each sub-pixel of the liquid crystal display device, the sensitivity to transmitted light that has passed through the color filter whose color has the shortest wavelength, that is to say, the color filter that is the color of color layer having transmission characteristics that are most toward the short wavelength side, is higher than the sensitivity to transmitted light that has passed through the color filter whose color has the longest wavelength, that is to say, the color filter that is the color of color layer having transmission characteristics that are most toward the long wavelength side. Note that when a normal RGB three-color color filter is considered, the color most toward the short wavelength side is blue (B), and the color most toward the long wavelength side is red (R).

Also, the silicon film formed from continuous grain silicon can be formed through, for example, the following steps.

First, a silicon oxide film and an amorphous silicon film are formed in the stated order on the interlayer insulating film 26 shown in FIG. 2. Next, a nickel thin-film that is a crystallization promotion catalyst is formed on the surface of the amorphous silicon film. Next, annealing is performed to cause a reaction between the nickel thin-film and the amorphous silicon film, thus forming a crystalline silicon layer at their interface. Thereafter, the unreacted nickel film and nickel silicide layer are eliminated by etching or the like. Next, annealing is performed on the remaining silicon film to promote crystallization, thus obtaining a silicon film formed from continuous grain silicon. Thereafter, the silicon layer is formed into a predetermined shape by forming a photoresist and performing etching, and furthermore various types of ion implantation are performed, thus completing the photodiodes 17.

Note that in the present embodiment, the photodiodes 17 are not limited to being formed from a silicon film composed of continuous grain silicon. It is sufficient for the photodiodes 17 to have a characteristic in which there is a tendency in which sensitivity increases as the wavelength of incident light becomes shorter, and one possible example of a photodiode whose sensitivity characteristics are the same as the characteristics of continuous grain silicon is a photodiode formed from polycrystalline silicon.

A silicon film formed from polycrystalline silicon can be formed, for example, as described below.

First, a silicon film composed of amorphous silicon is formed. Then, the silicon film composed of amorphous silicon is dehydrogenated by, for example, performing heating at 500° C. for two hours, and thereafter annealing is performed to cause crystallization to occur in the silicon film. This consequently obtains a silicon film composed of polycrystalline silicon. Examples of the annealing method include known laser annealing methods, such as a method in which an excimer laser irradiates a laser beam onto the amorphous silicon film.

Regarding the photodiodes 17 of the liquid crystal display device of the present embodiment, the following describes a form of the photoreception elements in the image detection function for image pick-up that is not readily influenced by interference due to irradiated light from the backlight, which is a liquid crystal display image, and that enables more efficiently picking up necessary image information.

Figure 4:
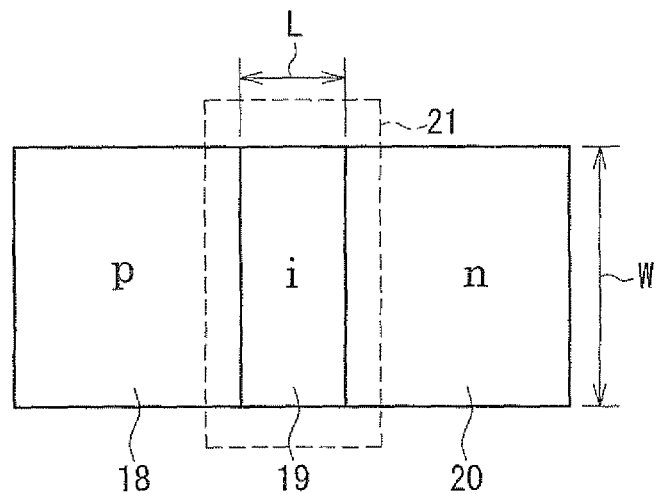
FIG. 4 is a plan view showing a positional relationship between the shape of a photodetection region of a photodiode and a high transmission portion provided in a color layer according to the embodiment of the present invention.

First is a description of the positional relationship between the shape of the photodiodes 17 and the high transmission portions 21 provided in the red (R) color layers 6b. FIG. 4 is a schematic diagram showing the positional relationship between the silicon film configuring one of the photodiodes 17 and the high transmission portion 21 provided in one of the red (R) color layers 6b, as viewed from the counter-substrate side.

As shown in FIG. 4, the photodiodes provided in the liquid crystal display device of the present embodiment are formed such that a length (W) of a joint face portion between the photodetection region layer) 19 and the p-type semiconductor region 18 or n-type semiconductor region 20 is longer than a distance (L) between the p-type semiconductor region 18 and the n-type semiconductor region 20. This is for the purpose of improving the sensitivity of the photodiode 17 by increasing the joint face area between the photodetection region 19 and the p semiconductor region 18 and n-type semiconductor region 20. As a result, the light photoreception region 19 of the photodiode 17 is an oblong. Note that since W is caused to be greater than L in order to increase the joint face area between the photodetection region 19 and the p semiconductor region 18 and n-type semiconductor region 20 as described above, it is not necessary for the light photoreception region 19 to be rectangular as shown in FIG. 4, and shapes such as a trapezoid, an ellipse, an oval, and a triangle are possible.

In this way, in accordance with the fact that the photodetection region 19 of the photodiode 17 is an oblong, that is to say, a shape in which W is greater than L, the shape of the high transmission portion 21 of the red (R) color layers 6b is also set to be an oblong likewise to the shape of the photodetection regions 19. Also, regarding their size, the high transmission portions 21 are formed so as to be a little larger than the photodetection regions 19 so that the photodetection regions 19 are entirely covered.

Note that the high transmission portion 21 refers to a region where the transmittance is higher than that of the surrounding color layer. The high transmission portion 21 can be obtained by, for example, providing an aperture portion in a color layer or providing a portion formed from a transparent layer in a color layer. Also, although the transmittance can be raised by reducing the thickness of the color layer in only the portion corresponding to the high transmission portion 21, in such a case it is necessary to reduce the thickness of the color layer as much as possible in view of the relationship with the sensitivity characteristics of the photodiode 17 with respect to the photoreception wavelength. Note that although the high transmission portion 21 is, as described above, formed so as to entirely cover the photodetection region 19 in the present embodiment shown in FIG. 4, the present invention is not necessarily limited to this, and it is sufficient for the high transmission portion 21 to be formed so as to overlap with at least part of the photodetection region.

Figure 5:
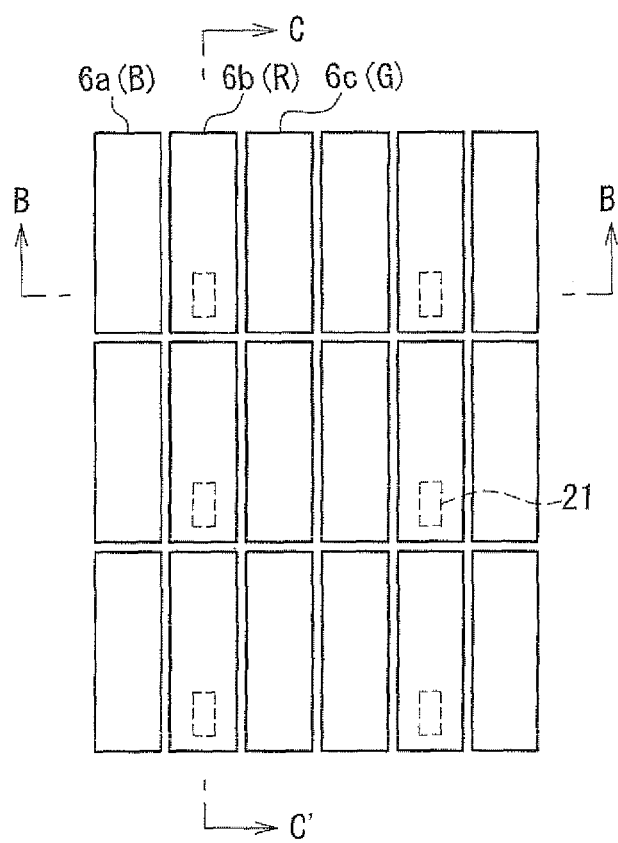
FIG. 5 is a plan view showing an arrangement of color layers provided in sub-pixels and positions of high transmission portions provided in the color layers according to the embodiment of the present invention.

Next, FIG. 5 is a plan view showing an array relationship of the blue (B) color layers 6a, the red (R) color layers 6b, and the green (G) color layers 6c, and also the positional relationship of the high transmission portion 21 provided in each of the red (R) color layers 6b, in the liquid crystal display device of the present embodiment.

FIG. 5 shows two pixels in the horizontal direction and three pixels in the vertical direction. Also, each of the pixels is divided into three sub-pixels aligned in the horizontal direction. Accordingly, FIG. 5 shows six sub-pixels in the horizontal direction and three sub-pixels in the vertical direction, which is a total of 18 sub-pixels, and the sub-pixels each have a corresponding color layer (6a, 6b, or 6c). Note that although the color layers are disposed in the order of blue, then red, then green from the left in each of the pixels in the present embodiment as shown in FIG. 5 as well, the order of colors in the array is not limited to this.

As described above, in the photodiodes 17 included in the sub-pixels of the liquid crystal display device of the present embodiment, there is a tendency in which the sensitivity characteristics increase as the incident light wavelength becomes shorter. In other words the photodiodes 17 have a characteristic of readily reacting to blue light, which has a short wavelength, and not readily reacting to red light, which has a long wavelength. To make use of this characteristic, the photodiodes 17 are disposed so as to overlap with the red (R) color layers 6b with respect to the thickness direction of the liquid crystal display device, thus reducing the influence of irradiated light from the backlight that has been reflected by a member disposed more toward the observer side than the liquid crystal panel.

In other words, in the liquid crystal display device according to the present embodiment, the photodiodes 17 are disposed so as to overlap with the red (R) color layer 6b for which the photoreception sensitivity is low, and therefore among the colors of light in the reflected irradiated light from the backlight, mainly only the red light that has passed through the red (R) color layers 6b falls on the photodiodes 17, thus preventing reflected irradiated light from the backlight from become influential as noise.

Also, in order to prevent a reduction in the photoreception sensitivity to external light that enters substantially perpendicular to the liquid crystal panel 4, which is originally to be detected by the photodiodes 17, the high transmission portions 21 are disposed so as to overlap with the photodetection regions 19 of the photodiodes 17 with respect to the thickness direction of the liquid crystal display device.

The following describes the principle according to which the reflection of a display image on sensor output caused by the reflection of light from the backlight is reduced by disposing the above-described photodiodes 17 so as to overlap with the red (R) color layers 6b, and furthermore providing the high transmission portions 21 in the red (R) color layers 6b so as to overlap with the photoreception regions 19 of the photodiodes 17, with reference to FIGS. 6 and 7. The following also describes a preferable orientation of the photoreception regions 19 of the photodiodes 17 with respect to the orientation in which the color layers 6a to 6c are formed in the liquid crystal display device.

Figure 6A:
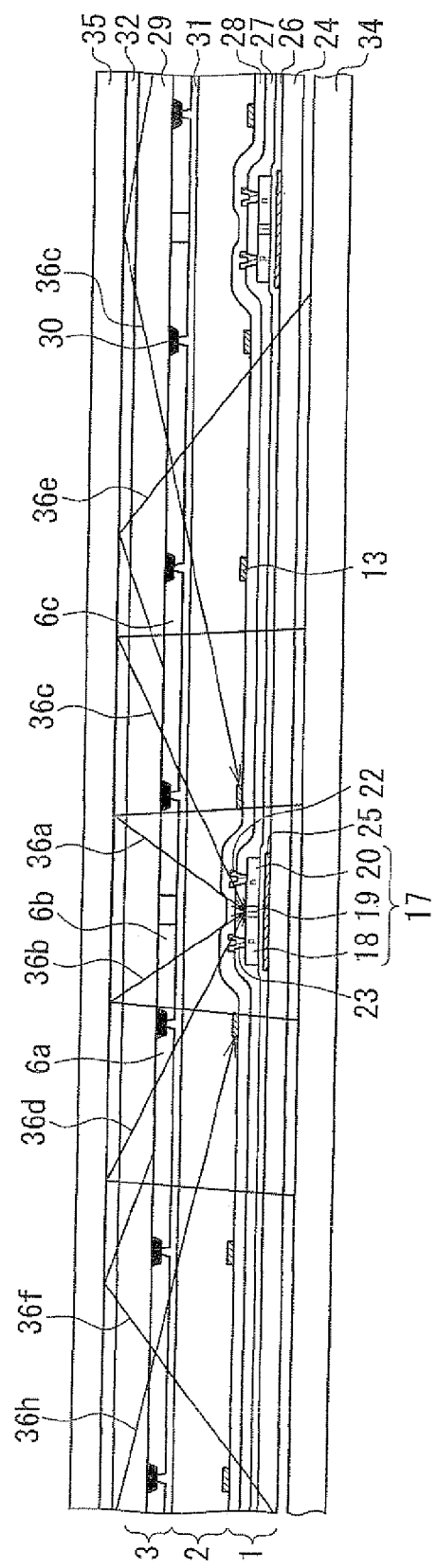
FIGS. 6A and 6B are schematic cross-sectional views respectively showing an outline configuration of cross section obtained by cutting along a cutting plane B-B' in FIG. 5.
Figure 6B:
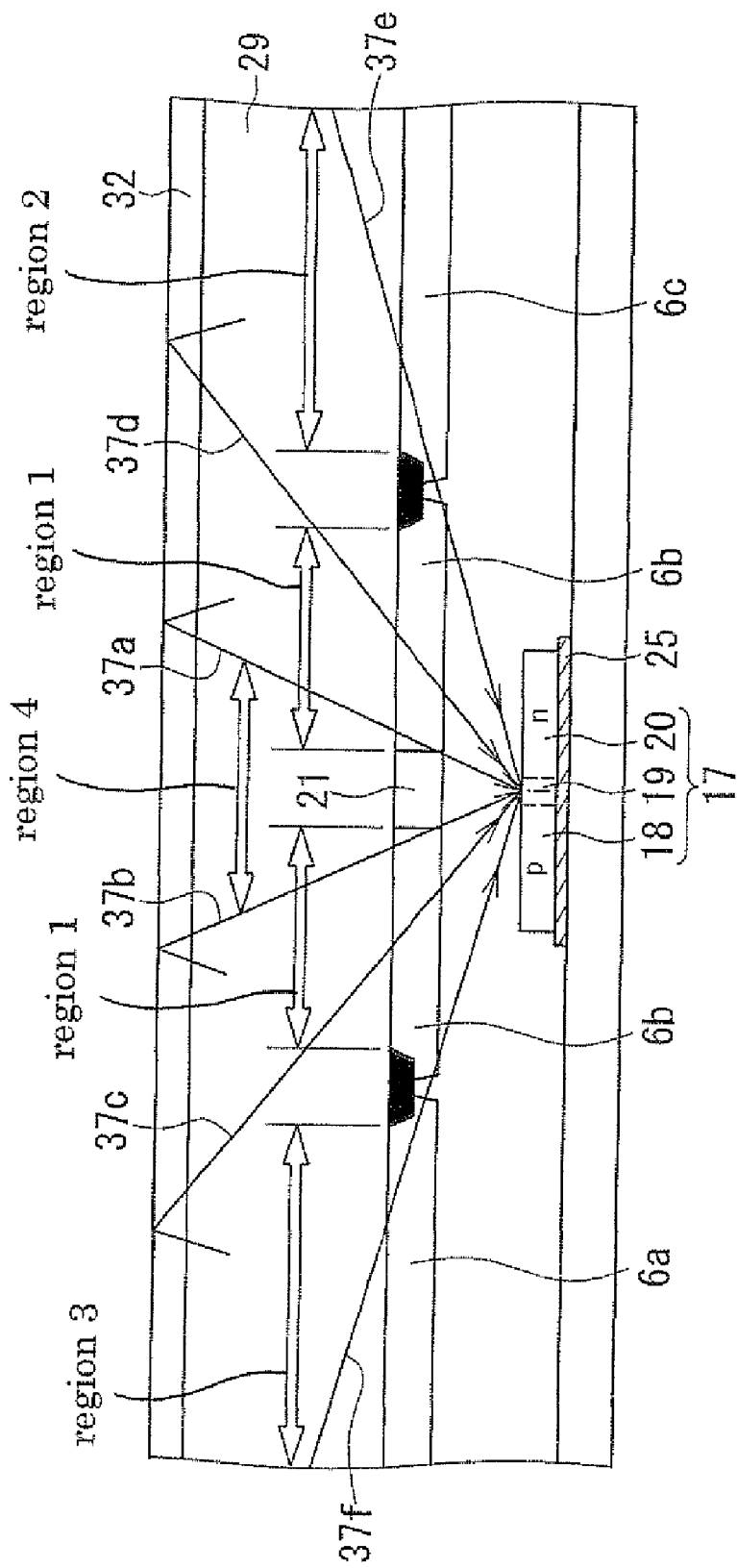
Figure 7A:
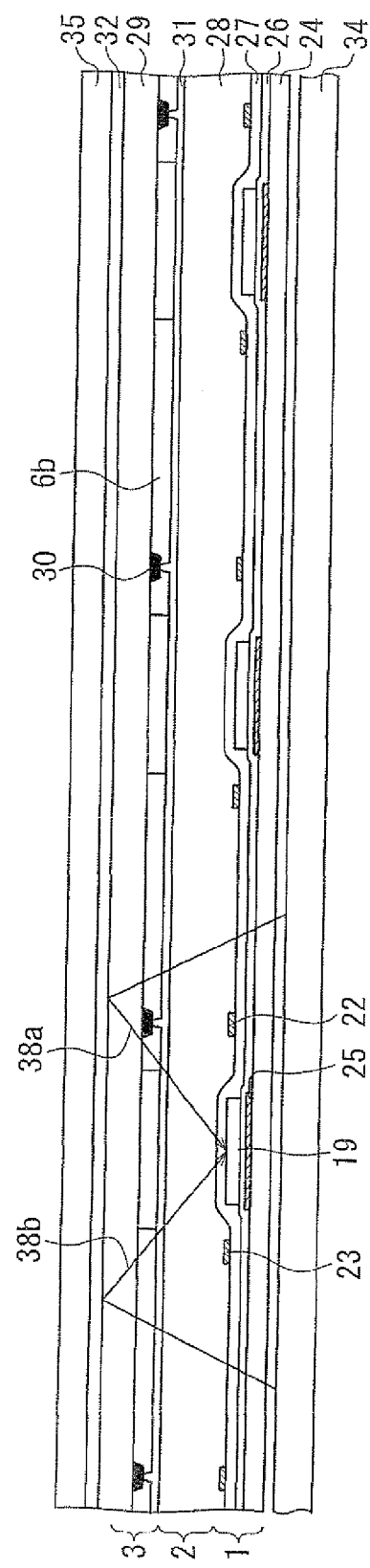
FIGS. 7A and 7B are schematic cross-sectional views respectively showing an outline configuration of a cross section obtained by cutting along a cutting plane C-C' in FIG. 5.
Figure 7B:
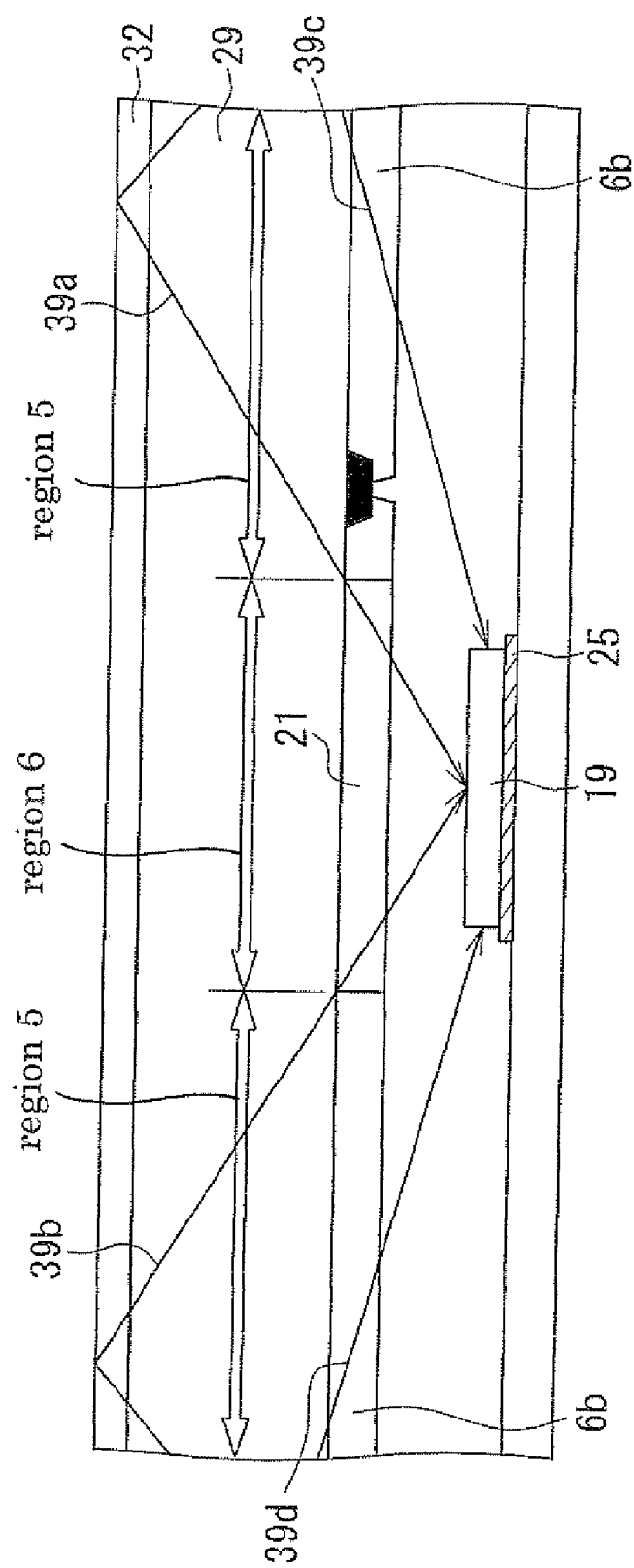

FIGS. 6A and 6B are cross-sectional diagrams showing a configuration of a cross section taken along a cutting plane B-B' shown in FIG. 5, and FIGS. 7A and 7B are cross-sectional diagrams showing a configuration of a cross-section taken along a cutting plane C-C' shown in FIG. 5. Note that FIGS. 6 and 7 aim to show the relationship between the color layers 6a to 6c and irradiated light from the backlight, and the positional relationship between the color layers 6a to 6c and the photoreception regions 19 of the photodiodes 17 in the liquid crystal display device, and therefore a depiction of part of the members has been omitted. Also, in the views shown in FIGS. 6 and 7, the thickness direction size is enlarged for particularly the members of the liquid crystal display device that are on the observer side, and therefore the aspect ratio in FIGS. 6 and 7 is not accurate.

As described above, FIG. 6A shows the configuration of the cross section of the liquid crystal, display device taken along the cutting plane B-B' shown in FIG. 5. In other words, FIG. 6A shows the configuration of a cross section in a direction corresponding to the horizontal direction (lateral direction) of the display screen in the liquid crystal display device in a normal condition.

In the liquid crystal display device of the present embodiment, the light shielding film 25 for preventing light from the backlight from falling on the photodiodes is formed on the backlight 34 side of the photodiodes 17. Accordingly, in the vicinity of the portion in which the photodiode 17 shown in FIG. 6A is formed, red light 36a and 36b, which is to be a red display image and has passed through the red (R) color layer 6b, is only light that has passed on the two sides of the light shielding film 25. The red light 36a and 36b is then reflected by the interface between the polarizing plate 32 and the protective panel 35, and falls on the photoreception region 19 of the photodiode 17. Since such light is red light for which the photoreception sensitivity of the photodiode 17 is originally low, and furthermore such light has passed through the red (R) color layer 6b two times before falling on the photodiode 17, the intensity of such light has been reduced, and even if such light has been received by the photodiode 17, the degree of influence as noise in the output signal is low.

Next, as shown in FIG. 6A, green light 36c, which is to be a green display image in the liquid crystal display device and has passed through the green (G) color layer 6c, is reflected by the interface between the polarizing plate 32 and the protective panel 35, and falls on the photoreception region 19 of the photodiode 17. In this case, depending on the irradiation angle from the backlight, the green light 36c passes through either the green (G) color layer 6c or the red (R) color layer 6b before falling on the photodiode 17.

Likewise, as shown in FIG. 6A, blue light 36d, which is to be a blue display image in the liquid crystal display device and has passed through the blue (B) color layer 6a, is reflected by the interface between the polarizing plate 32 and the protective panel 35, and falls on the photoreception region 19 of the photodiode 17. In this case, depending on the irradiation angle from the backlight, the blue light 36d passes through either the blue (B) color layer 6a or the red (R) color layer 6b before falling on the photodiode 17.

Note that the light that has the possibility of falling on the photodiode 17 is not limited to being light that, as has been examined above, has passed through the red (R) color layer 6b formed so as to overlap with the position at which the photodiode 17 is formed, and the green (G) color layer 6c and the blue (B) color layer 6a that are adjacent to the red (R) color layer 6b. For example, light that has passed through color layers at positions farther away that are formed on the left and right outer sides in FIG. 6A approaches toward where the photodiode 17 is formed depending on the reflection angle of such light. However, due to normally passing through two different colors of color layers, the brightness of such light is significantly reduced due to being influenced by the transmittance rates in the respective color layers, and even if such light has fallen on the photodiode, the possibility of becoming noise is extremely low.

Specifically, in the example shown in FIG. 6A, blue light 36e, which has passed through the blue (B) color layer two positions away (on the right side in FIG. 6A) from the red (R) color layer provided at the position where the photodiode 17 is formed, is reflected by the interface between the polarizing plate 32 and the protective panel 35, and falls on the green (G) color layer 6c. In this case, the blue light 36e is light whose transmittance corresponds to a multiplication of the transmittance in the blue region of the first color layer through which such light travels and the transmittance in the green region of the second color layer through which such light travels, and the quantity of such light is very small.

Likewise, green light 36f as well, which has passed through the green (G) color layer two positions away (on the left side in FIG. 6A) from the red (R) color layer provided at the position where the photodiode 17 is formed, falls on the blue (B) color layer 6a, and likewise to the above-described blue light 36e, the quantity of such light is very small. In order to show such a condition, the light 36e and 36f is shown as disappearing upon falling on the second color of color layer in FIG. 6A.

Note that as shown in FIG. 6A, light 36g and 36h, which is approaching from even farther away toward where the photodiode 17 is formed, has a very shallow angle of incidence, and therefore the possibility of falling on the photoreception region 19 of the photodiode 17 is very low, and the possibility of being a factor of nose is low.

Based on the above, in considering photoreception noise in the photodiode 17, it is favorable to take into account reflected light that falls on the photodiode 17 after passing through the red (R) color layer 6*b* formed so as to overlap with the photodiode 17 and the green (G) color layer 6*c* or the blue (B) color layer 6*a* that is adjacent with the red (R) color layer 6*b*. In view of this, this following is an additional description of the influence of such reflected light with reference to FIG. 6B for describing the principle according to which the effect of the liquid crystal display device according to the present embodiment can be obtained.

FIG. 6B shows a schematic configuration of the cross section of the liquid crystal display device according to the present invention likewise to FIG. 6A. Irradiated light from the backlight that is reflected by the polarizing plate 32 or a member farther on the observer side and falls on the photodiode 17 is divided into four regions, namely a region 1, a region 2, a region 3, and a region 4, according to the color layer through which the incident light passes.

The region 1 is a region where light passes through the red (R) color layer 6*b* and falls on the photoreception region 19 of the photodiode 17. Light 37*a*, 37*b*, 37*c*, and 37*d* that passes through the region 1 falls on the photodiode 17 as red light for which the photoreception sensitivity of the photodiode 17 in the present embodiment is low as described above, regardless of the color that the original light is.

In this case, the red light 37*a* and 37*b* that has passed through the red (R) color layer 6*b* passes through the red (R) color layer 6*b* two times, and therefore is influenced by the transmittance thereof two times. Also, the blue light 37*c* that has passed through the blue (B) color layer 6*a* and the green light 37*d* that has passed through the green (G) color layer 6*c* respectively pass through two different colors of color layers, namely blue and red, or green and red, and therefore only wavelengths common to the two colors of color layers can pass through. These principles show that if such light has passed through the region 1 and fallen on the photodiode 17, the possibility of influencing the photoreception signal as noise is very low.

The light 37*e* that passes through the region 2 falls on the photoreception region 19 of the photodiode 17 after passing through the green (G) color layer 6*c*. The photoreception sensitivity to such light is therefore higher than that of the light that passes through the region 1 and falls on the photodiode 17. Also, the light 37*f* that passes through the region 3 falls on the photodiode 17 after passing through the blue (B) color layer 6*a*, and therefore the photoreception sensitivity of the photodiode 17 to such light is even higher.

The region 4 is a region where light that passes through the high transmission portion 21 of the red (R) color layer 6*b*, which is formed so as to overlap with the photoreception region 19 of the photodiode 17, and falls on the photodiode 17. Unlike the light that passes through the above-described regions 1 to 3 and falls on the photodiode 17, the light that passes through the region 4 is light that, in the exemplary case in which the high transmission portion 21 is an aperture provided in the red (R) color layer 6*b*, has passed only one time through the color layer whose color is the original display color. However, as illustrated in FIG. 6A, due to the positional relationship between the region 4 and the photoreception region 19 of the photodiode 17, the light that passes through the region 4 is almost always light that has passed through the color layer formed in the sub-pixel in which the photodiode 17 is formed and that is at the same position as the region 4. Accordingly, the light that passes through the region 4 in the case of the present embodiment is mainly red light for which the photoreception sensitivity of the photodiode 17 is low. Note that the tendency for the light that has passed through the region 4 to be mainly light that has passed through the color layer formed in the sub-pixel in which the photodiode 17 is formed becomes more prominent as the distance between the photodiode 17 and the polarizing plate 32 decreases. In other words, by employing a countermeasure of for example, reducing the thickness of the glass substrate 29 that is the base substrate of the counter-substrate 3 or forming the polarizing plate 32 on the liquid crystal layer 2 side of the glass substrate 29, the light that passes through the region 4 is red light for which the photoreception sensitivity of the photodiode is low, thereby enabling reducing the extent to which such light becomes noise.

The above has been an examination of the extent to which light that passes through the regions 1 to 4 has influence as noise in the photoreception signal of the photodiodes 17, with reference to FIG. 6B. As is also clear from FIG. 6B, regarding the viewing angle as viewed from the photoreception region of the photodiode 17, the proportion occupied by the regions 1 and 4 is high, and in contrast, the proportion occupied by the regions 2 and 3 is very low.

Accordingly, in the present embodiment, since suppressing the influence of light that falls on the photodiodes 17 from the regions 1 to 4 is important, it is very effective to dispose the photodiodes 17 so as to, with respect to the thickness direction of the liquid crystal panel, overlap with the red (R) color layers for which the photoreception sensitivity of the photodiodes is low. Since the photoreception characteristics of the photodiodes 17 according to the present embodiment have the wavelength characteristics shown in FIG. 3, it is evident that, compared to the case of providing the photodiodes so as to overlap with the blue (B) color layer 6*a*, causing the photodiodes to overlap with the red (R) color layer reduces the photoreception sensitivity to approximately $1/20$, thereby enabling significantly reducing the possibility that reflected light of a display image will become noise in the photoreception signal.

Next, as described above, FIG. 7A shows the configuration of the cross section of the liquid crystal display device taken along the cutting plane C-C' shown in FIG. 5. In other words, FIG. 7A shows the configuration of a cross section in a direction corresponding to the vertical direction (longitudinal direction) of the display screen in the liquid crystal display device in a normal condition.

As shown in FIG. 5, in the liquid crystal display device of the present embodiment, the same color of color layers are formed so as to be aligned in the vertical direction of the screen. Accordingly, all of the color layers appearing in the structure of the cross section taken along the line C-C' are the red (R) color layer 611

As shown in FIG. 7A, irradiated light 38*a* and 38*b* from the back light, which is for displaying an image and appears in this cross section, are both red light, and red light that has been reflected by the interface between, for example, the polarizing plate 32 provided on the observer side of the liquid crystal display device and the acrylic plate 35 that protects the liquid crystal panel farther outward falls on the photodiode 17 after passing through the red (R) color layer 6*b* two times or passing through the high transmission portion 21.

Likewise to FIG. 6B, FIG. 7B is a diagram for describing the principle according to which the effect of the liquid crystal display device according to the present embodiment can be obtained, and likewise to FIG. 7A, FIG. 7B shows a schematic configuration of the cross-section in the vertical direction of the display face of the liquid crystal display device according to the present embodiment.

As shown in FIG. 7B, in the perpendicular direction of the display face of the liquid crystal display device, there can be regions in which light 39c and 39d passes through the red (R) color layer 6b two times before falling on the photoreception region 19 of the photodiode 17, which are shown as regions 5, and a region in which light 39a and 39b passes through the high transmission portion 21, such as an aperture part, provided in the red (R) color layer 6b before falling on the photoreception region 19 of the photodiode 17, which is shown as a region 6.

However, unlike the light appearing in the cross section in the horizontal direction of the display screen shown in FIG. 6B, the light appearing in the cross-sectional diagram in the vertical direction of the display face shown in FIG. 7B is red light for which the photoreception sensitivity of the photodiode 17 is low, no matter which region the light passes through. Accordingly, it is very effective to dispose the photodiodes 17 so as to, with respect to the thickness direction of the liquid crystal display device, overlap with the red (R) color layer for which the photoreception sensitivity of the photodiodes is low, as with the liquid crystal display device of the present embodiment.

Also, when considering the case in which the size of the high transmission portion 21 has been increased, if the cross section in the horizontal direction of the display screen is as shown in FIGS. 6A and 6B, there is an increase in the proportion of light that passes through the red (R) color layer for which the photoreception sensitivity of the photodiode 17 is low, or in other words, the proportion of light that passes through the regions 1 and 4 shown in FIG. 6B. Here, in the case of the cross section in the vertical direction of the display screen as shown in FIGS. 7A and 7B, even if the size of the high transmission portion 21 is increased, there is no change in the color of light that falls on the photodiode 17, and thus there is no change in the photoreception sensitivity due to the color of incident light.

Accordingly, in the liquid crystal display device according to the present embodiment, the oblong shape of the photoreception region 19 for improving the photoreception sensitivity of the photodiodes, and the corresponding oblong shape of the high transmission portions 21, which were examined with reference to FIG. 4, are configured such that the lengthwise directions thereof are aligned in the vertical direction of the display screen, or in other words, the direction in which the same color of color layers of are consecutively arranged, and it is evident that this enables improving the photoreception capability of the photodiodes while preventing reflected light from becoming noise.

Accordingly, it is evident that forming the photodiodes 17 so as to overlap with the red (R) color layer 6b, and causing the lengthwise direction (the W direction in FIG. 4) of the photodetection regions 19 of the photodiodes 17 to conform to the direction in which the red (R) color layers 6b are aligned enables most effectively reducing the influence of reflection on the photodiodes 17, which are photosensors, caused by the reflection of irradiated light from the backlight.

Note that the photodiodes 17 of the liquid crystal display device in the above embodiment of the present invention are formed from a silicon film composed of continuous grain silicon, polycrystalline silicon, or the like. However, the photosensors used in the liquid crystal display device according to the present embodiment are not limited to being photodiodes that use such silicon films. It is sufficient for the photosensors to have a characteristic in which there is a tendency in which photoreception sensitivity increases as the wavelength of incident light becomes shorter, and for example, a phototransistor or the like can be used.

Also, although a transparent type of liquid crystal panel and a liquid crystal display device having a backlight that irradiates the liquid crystal panel are described in the above embodiment of the present invention, the liquid crystal panel used in the liquid crystal display device that is the display device according to the present invention is not limited to this. For example, it is possible for the image display panel including an image detection function to be a reflective type of liquid crystal panel in which external light is reflected by reflecting electrodes provided on the active matrix substrate on the back face side and images are displayed with use of such reflected light. In this way, it can be easily seen that even in the case of using a reflective type of liquid crystal panel, if the light that is reflected by the reflecting electrodes and forms a display image becomes noise due to falling on the photosensors as a result of optical interference, applying the present invention enables exhibiting the same effects as in the case of the transmission type of liquid crystal panel. Furthermore, it is possible to use a semiconductor type of liquid crystal panel in which both irradiated light from a backlight and reflected light that has been reflected by reflecting electrodes are used in image display.

Furthermore, the image display panel used in the image display device according to the present invention is not limited to being an image display panel that uses the liquid crystal panel described as the above embodiment, and the use of another transmission type of image display panel, or a self-luminous type of image display panel is also possible. An example of a self-luminous type of image display panel is an image display panel having an image detection function in which images are displayed by converting light emitted by an organic or inorganic EL material into a predetermined color with use of a color filter instead of using the emitted color of light as is. This is because with self-luminous materials, compared to directly obtaining a specific color of emitted light, the luminous efficiency for each color is higher when color conversion is performed, such as in the exemplary case of converting high-intensity white light into the three colors R, G, and B with use of a filter. With such a self-luminous type of image display panel, since images are displayed using light that has passed through a color filter, there is the problem of reflection on the photosensors caused by optical interference likewise to the display device using the liquid crystal panel described in the above embodiment of the present invention, and applying the above-described configuration of the present invention enables significantly reducing the influence of noise caused by such reflection.

Furthermore, although the color filter is provided on the counter-substrate in the description of the above embodiment, the image display panel used in the display device according to the present invention is not limited to this, and in the case of a liquid crystal panel, technology called "CF on array" in which a color filter is provided on an active matrix substrate may be used. Note that in this case, it goes without saying that the configuration should be such that, with respect to the thickness direction of the image display panel, first photosensors are provided on the active matrix substrate on the back face side, and then a color filter is formed over the photosensors.

INDUSTRIAL APPLICABILITY

As described above, according to the present invention, in the case of performing sensing while performing a display in an image display device with an image detection function, it is possible to reduce the reflection of a display image on sensor output that occurs due to reflected light from a backlight that has been reflected by, for example, an interface between constituent members of the image display device. Accordingly, an image display device with an image detection function of the present invention has industrially applicability.

The invention claimed is:

1. An image display device comprising an image display panel with an image detection function provided with an active matrix substrate and a counter-substrate,
    the active matrix substrate being provided with a plurality of pixels disposed in a matrix, and a plurality of photosensors disposed in correspondence with the pixels in a display region,
    the plurality of pixels each having a plurality of sub-pixels, and
    the image display device comprising a color filter in which colors of color layers are formed in correspondence with the sub-pixels,
    wherein the photosensors have an incident light wavelength characteristic in which a photoreception sensitivity to light that passes through, among the colors of color layers, the color layer whose color is most toward a short wavelength side is higher than a photoreception sensitivity to light that passes through, among the colors of color layers, the color layer whose color is most toward a long wavelength side, and the photosensors are disposed such that, with respect to a thickness direction of the image display panel, photodetection regions of the photosensors overlap with, among the plurality of color layers, the color layer whose color is most toward the long wavelength side.

2. The image display device according to claim 1, wherein the color filter is provided on the counter-substrate.

3. The image display device according to claim 1, wherein the color filter is provided on the active matrix substrate.

4. The image display device according to claim 1,
    wherein the color layers have a high transmission portion in which a transmittance is higher than that of a periphery thereof, and
    the high transmission portions are provided so as to at least partially overlap with the photodetection regions with respect to the thickness direction of the image display panel.

5. The image display device according to claim 4, wherein an area of each of the high transmission portions is greater than an area of each of the photodetection regions of the photosensors, and the high transmission portions are formed so as to entirely cover the photodetection regions.

6. The image display device according to claim 4, wherein same colors of the color layers are aligned consecutively in one of a row direction and a column direction of the pixels disposed in the matrix, and a shape of the photodetection regions of the photosensors is an oblong, a lengthwise direction of the oblong shape conforming to the direction in which the same colors of the color layers are aligned consecutively.

7. The image display device according to claim 1, wherein the image display panel is a liquid crystal panel.

8. The image display device according to claim 7, further comprising:
    a backlight that irradiates light on the liquid crystal panel,
    wherein a light shielding film is included between the photosensors and the backlight, and the light shielding film is formed so as to entirely cover the high transmission portions with respect to a thickness direction of the liquid crystal panel.

* * * * *